(12) United States Patent
Liou (10) Patent No.: US 8,258,616 B1
(45) Date of Patent: Sep. 4, 2012

(54) SEMICONDUCTOR DICE HAVING A SHIELDED AREA CREATED UNDER BOND WIRES CONNECTING PAIRS OF BONDING PADS

(75) Inventor: Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 1422 days.

(21) Appl. No.: 11/024,309

(22) Filed: Dec. 28, 2004

Related U.S. Application Data (60) Continuation-in-part of application No. 10/780,605, filed on Feb. 19, 2004, now Pat. No. 6,982,220, which is a division of application No. 10/051,965, filed on Jan. 16, 2002, now Pat. No. 6,770,982.

(51) Int. Cl.
*H01L 23/48* (2006.01)
(52) U.S. Cl. .. 257/692; 257/779; 257/784; 257/E23.024
(58) Field of Classification Search .................. 257/665, 257/690, 779, 784
See application file for complete search history.

(56) References Cited

U.S. PATENT DOCUMENTS

| | | |
|---|---|---|
| 4,359,754 A | 11/1982 | Hayakawa et al. |
| 4,403,240 A | 9/1983 | Seki et al. |
| 5,384,487 A | 1/1995 | Rostoker et al. |
| 5,495,398 A | 2/1996 | Takiar et al. |
| 5,838,072 A | 11/1998 | Li et al. |
| 5,869,870 A | 2/1999 | Lin |
| 5,905,639 A | 5/1999 | Warren |
| 5,960,262 A | 9/1999 | Torres et al. |
| 5,986,345 A | 11/1999 | Monnot |
| 5,989,939 A | 11/1999 | Fjelstad |
| 6,025,616 A | 2/2000 | Nguyen et al. |
| 6,043,539 A | 3/2000 | Sugasawara |
| 6,091,140 A | 7/2000 | Toh et al. |
| 6,097,098 A | 8/2000 | Ball |
| 6,107,681 A | 8/2000 | Lin |
| 6,144,093 A | 11/2000 | Davis et al. |
| 6,169,331 B1 | 1/2001 | Manning et al. |
| 6,211,565 B1 | 4/2001 | Yu |
| 6,246,113 B1 | 6/2001 | Lin |
| 6,348,400 B1 | 2/2002 | Schoenfeld |
| 6,424,223 B1 | 7/2002 | Wang |

*Primary Examiner* — Anh Mai (57) ABSTRACT

An integrated circuit comprises a semiconductor die including N bond pad pairs each including a first bond pad and a second bond pad that is spaced from the first bond pad. N bond wires are associated with a respective one of the N bond pad pairs. Each of the bond wires have opposite ends that communicate with the first and second bond pads of a respective one of the N bond pad pairs. The first and second bond pads of the N bond pad pairs are connected to a reference potential and create a shielded area between the N bond pad pairs.

23 Claims, 6 Drawing Sheets

SEMICONDUCTOR DICE HAVING A SHIELDED AREA CREATED UNDER BOND WIRES CONNECTING PAIRS OF BONDING PADS

CROSS-REFERENCE TO RELATED APPLICATIONS

This application is a continuation-in-part of U.S. patent application Ser. No. 10/780,605 filed on Feb. 19, 2004, which is a divisional of U.S. Pat. No. 6,770,982 issued Aug. 3, 2004, both of which are hereby incorporated by reference in their entirety.

TECHNICAL FIELD

This invention relates to power and signal distribution in semiconductor dies.

BACKGROUND

Many conventional semiconductors are mounted in packages such as Quad Flat Packs (QFPs) and Pin Ball Gate Arrays (PBGAs) in which the input and output terminals are arranged along the edge of the die. Arranging the terminals along the die edge may result in relatively long wirings on silicon to supply power and ground to the center of the die. These long wirings generally have a relatively high resistance leading to unacceptable IR voltage drops.

SUMMARY OF THE INVENTION

An integrated circuit according to some implementations comprises a semiconductor die including N bond pad pairs each including a first bond pad and a second bond pad that is spaced from the first bond pad. N bond wires are provided, each associated with a respective one of the N bond pad pairs. Each of the bond wires has opposite ends that communicate with the first and second bond pads of a respective one of the N bond pad pairs. The first and second bond pads of the N bond pad pairs are connected to a reference potential and create a shielded area between the N bond pad pairs.

In other features, the bond wires comprise a metallic material selected from the group consisting of gold, aluminum, and copper. The bond wires are bonded to the first and second bond pads using a wire bond type selected from the group consisting of ball bonds, stitch bonds, stitch bonds on bonding pad, and stitch bonds on ball. An interconnecting layer in the semiconductor die is connected by vias to at least one of the first bond pads of at least one of the N bond pad pairs. The reference potential is ground.

In other features, an I/O bond pad is arranged on the semiconductor die. An I/O bond wire has one end that communicates with the lead finger and an opposite end that communicates with the reference potential.

A system comprises the integrated circuit and further comprises a lead finger that communicates with the reference potential and the opposite end of the I/O bond wire.

In still other features, an I/O bond pad directly contacts at least one of the first bond pads of at least one of the N bond pad pairs. The first bond pads of the N bond pad pairs contact each other.

In other features, an I/O bond pad is connected to a first via, which is connected by an interconnecting layer and a second via to at least one of the first bond pads of at least one of the N bond pad pairs.

In still other features, an I/O bond pad directly contacts at least one of the first bond pads of the N bond pad pairs. Remaining ones of the first bond pads are connected by vias and an interconnecting layer to the at least one of the first bond pads.

In other features, an I/O bond pad is connected to a first via, which is connected to by an interconnecting layer and a second via to at least one of the first bond pads of the N bond pad pairs. Remaining ones of the first bond pads are directly connected to the at least one of the first bond pads. A circuit is fabricated in the semiconductor die in the shielded area.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DESCRIPTION OF DRAWINGS

Like reference symbols in the various drawings indicate like elements.

DETAILED DESCRIPTION

Figure 1:
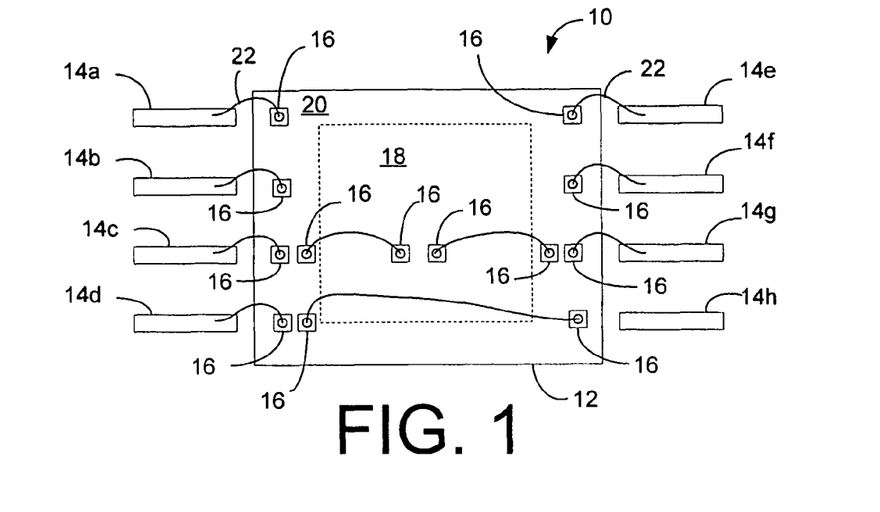
FIG. 1 is a two-dimensional top-view of a semiconductor device.

FIG. 1 shows a top-view of a semiconductor power distribution system and method. A semiconductor device 10 includes a semiconductor die 12 and several lead fingers 14a-14h. The semiconductor device 10 may be mounted in any suitable package such as QFPs and PBGAs.

The semiconductor die 12 includes bonding surfaces 16 arranged in an interior portion 18 of the semiconductor die 12 as well as along an outer periphery 20 of the semiconductor die 12. The bonding surfaces 16 are preferably bonding pads connected to traces in the semiconductor die 12. The bonding surfaces 16 provide connection points for lead wires 22 extending to other bonding surfaces 16 or lead fingers 14.

Employing a lead wire 22 within the interior portion 18 may advantageously reduce the voltage drop caused by IR losses in a trace. In addition, a lead wire 22 may be used in place of a trace to reduce the density of traces within the semiconductor die 12. Using a lead wire 22 to couple electrical signals to internal portions of the semiconductor 12 may be particularly advantageous in high density semiconductors where using wide low resistance traces to carry the signal would require additional layers. In one example, a lead wire 22 may be connected in parallel with a trace in the semiconductor die 18 to reduce the combined resistance, thereby decreasing the voltage drop associated with the trace. In a second example, a lead wire 22 may be used in lieu of using a trace within the semiconductor die 18. In a third example, a lead wire may be connected from a bonding surface 16 located along one edge of the semiconductor periphery 20 to another bonding surface 16 located along another edge of the semiconductor periphery 20.

The lead wires 22 are bonded to different ones of the bonding surfaces 16 and/or lead finger 14 to provide low resistance connections for electrical signals such as power, ground, and signals. The lead wires 22 may comprise an electrically conductive material such as gold, aluminum, and copper that has a low electrical resistance. Each of the lead fingers 14 may be coupled to a bonding surface or remain as a non-connected lead finger 14h. Any wire bonding method such as thermocompression and ultrasonic may be used to bond the lead wires 22 to the bonding surfaces 16 and lead fingers 14.

The lead wires 22 may be bonded using any wire bond type such as ball bond, stitch bond on bonding pad, and stitch bond on ball. A ball bond may be formed by first forming a sphere at the end of a lead wire. Then, the sphere is pressed against a bonding surface for a few seconds to form a weld. A stitch bond on bonding pad may be formed by placing the tail of a lead parallel to a bonding surface. Then, pressure is applied to the lead wire forcing the lead wire onto the bonding pad. A stitch bond on ball may be formed in similar manner to forming a stitch bond on bonding pad, except a ball is first formed on the bonding surface.

Figure 2:
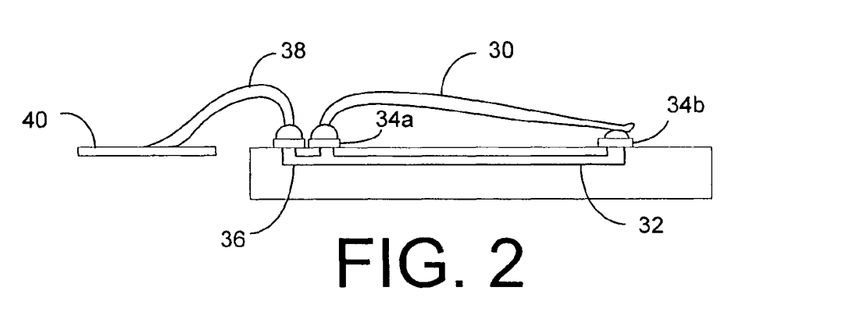
FIG. 2 is a two-dimensional side-view of a semiconductor device.

FIG. 2 shows another aspect of the semiconductor power distribution system. A lead wire 30 is connected in parallel with a trace 32 to reduce the electrical resistance of a connection between two bonding surfaces 34a and 34b. The lead wire 30 may be connected via a trace 36 to another lead wire 38 that is connected to a lead finger 40. The lead wire 30 reduces the voltage losses associated with the electrical resistance of the trace 32 by providing a parallel path for current.

Figure 3:
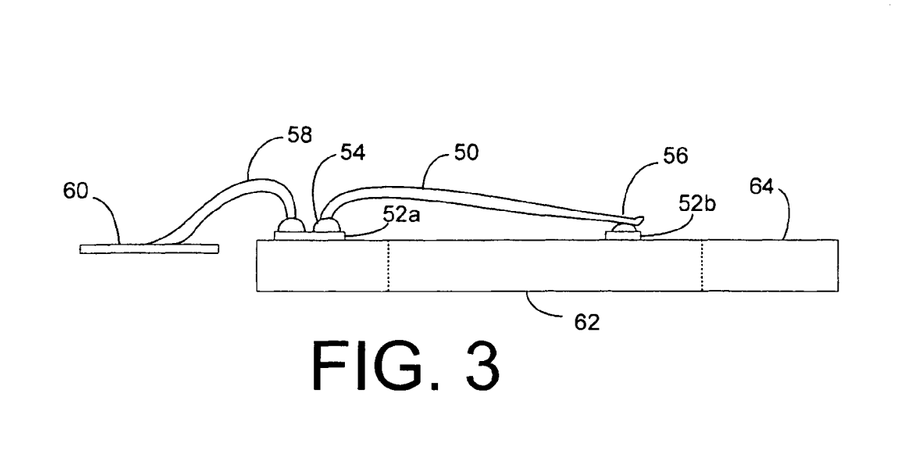
FIG. 3 is a two-dimensional side-view of a semiconductor device.

FIG. 3 shows another aspect of the semiconductor power distribution system and method. A lead wire 50 is connected between two bonding surfaces 52a and 52b. The bonding surface 52b is preferably located within an interior portion 62 of a semiconductor die 64. The lead wire 50 is used in lieu of a trace to carry electrical signals between the bonding surfaces 52a and 52b. The lead wire 50 may be coupled to the bonding surfaces 52a and 52b via a ball bond 54 and a stitch bond on ball 56 respectively. Another lead wire 58 may connect the bonding surface 52a to a lead finger 60 so that signals may be coupled between the lead finger 60 and the interior portion 62 of the semiconductor die 64 without traversing within the semiconductor die 64.

Figure 4:
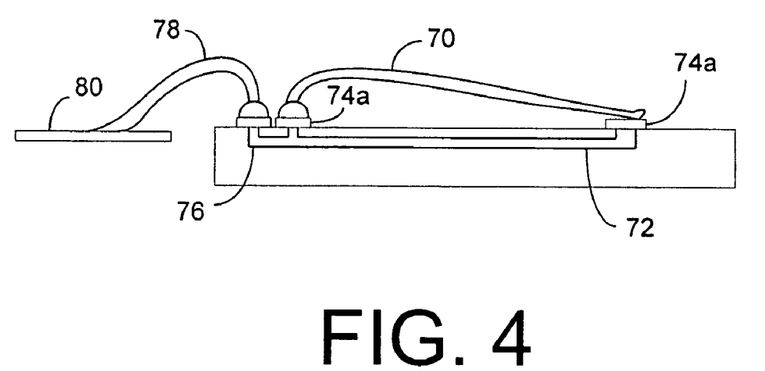
FIG. 4 is a two-dimensional side-view of a semiconductor device.

FIG. 4 shows another aspect of the semiconductor power distribution system and method similar to that shown in FIG. 2 in function with corresponding elements numbered in the range 70 to 80, except that the lead wire 70 is connected at bonding surface 74b with a stitch on pad type of bond.

Figure 5:
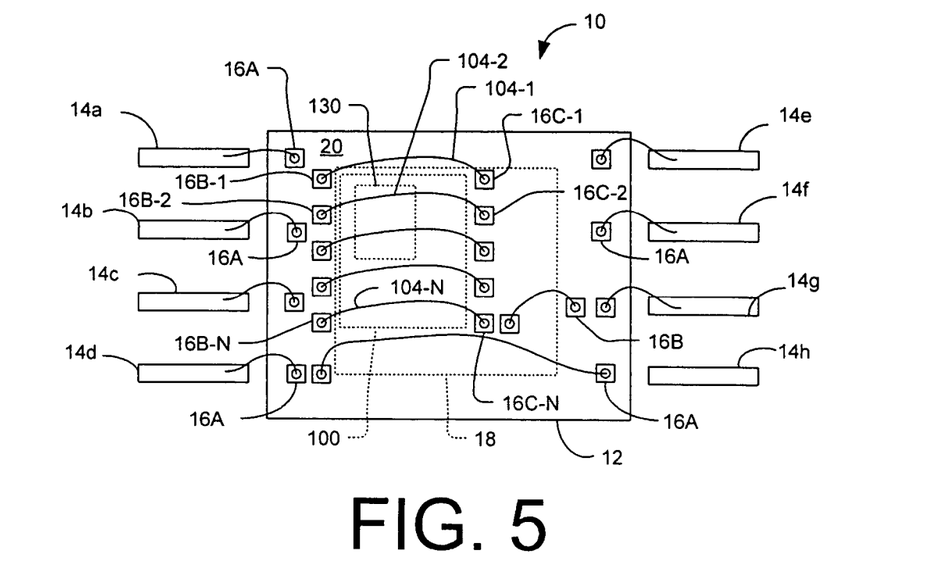
FIG. 5 is a two-dimensional top-view of a semiconductor device with a shielded area of a semiconductor die located between bond surfaces connected by bond wires according to some implementations.

Referring now to FIG. 5, a two-dimensional top-view of a semiconductor device 10 is shown. The semiconductor device 10 includes one or more shielded areas 100 that are located between bonding surfaces 16B-1, 16B-2, . . . and 16B-N (collectively bonding surfaces 16B) in the outer periphery 20 and bonding surfaces 16C-1, 16C-2, . . . and 16C-N (collectively bonding surfaces 16C) in the inner portion 18.

Bonding surfaces 16A are associated with input/output connections to lead fingers 14 as previously described above, although other methods of connecting the reference potential may be used. The shielded areas 100 are located between bonding pads 16B and 16C that are connected by bond wires 104-1, 104-2, . . . , and 104-N (collectively bond wires 104). As can be appreciated, while a generally rectangular shielded area 100 is shown in FIG. 5, the shielded area 100 can have any other suitable shape or size.

Figure 6:
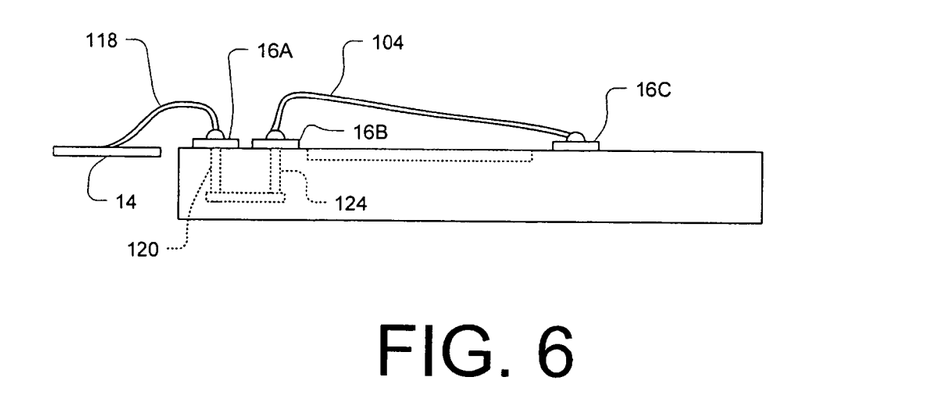
FIG. 6 is a simplified and enlarged two-dimensional side-view of the semiconductor device of FIG. 5.

Referring now to FIG. 6, a side view of the semiconductor device 10 is shown. Ground or another reference potential is connected to one or more lead fingers 14. One or more input/output (I/O) bond wires 118 connect the lead fingers 118 to the bonding surfaces 16A. One or more vias 120 connect the bonding surfaces 16A to one or more interconnecting layers 122. One or more vias 124 connect the one or more interconnecting layers 122 to bonding surfaces 16B. As can be appreciated, the interconnecting layers and additional vias can optionally be used to provide a connection to bonding surfaces 16C. Still other approaches may be used to supply ground or another reference potential to the bonding surfaces 16B and 16C. As can be appreciated by skilled artisans, the shielded areas 100 have reduced interference and/or crosstalk as compared to unshielded areas. Therefore, one or more circuits 130 may be fabricated in the shielded areas 100. For example, the circuits 130 may be particularly sensitive to interference and/or crosstalk.

Figure 7:
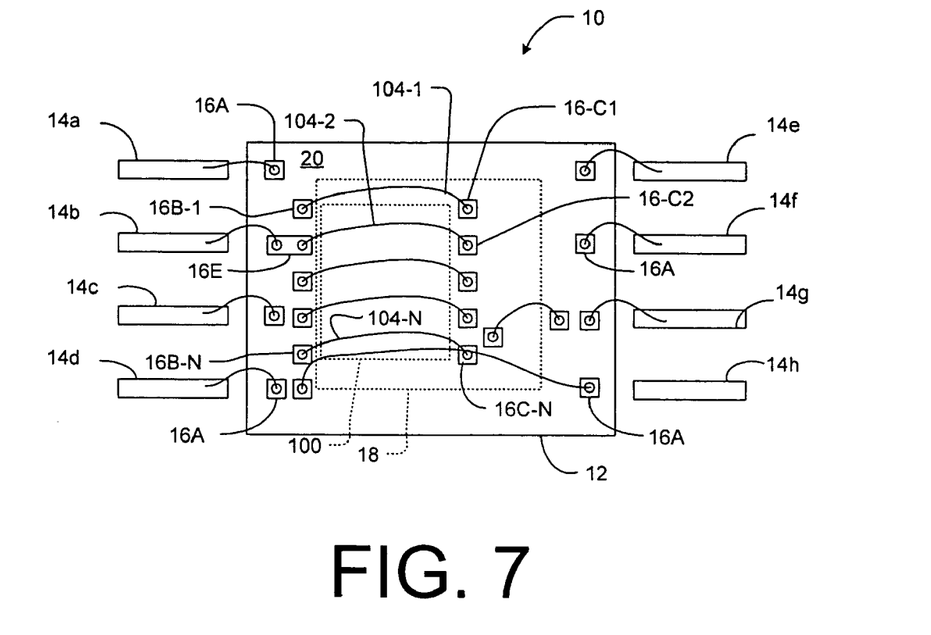
FIG. 7 is a two-dimensional top-view of a semiconductor device with a shielded area of a semiconductor die located between bond surfaces connected by bond wires according to some implementations.
Figure 8:
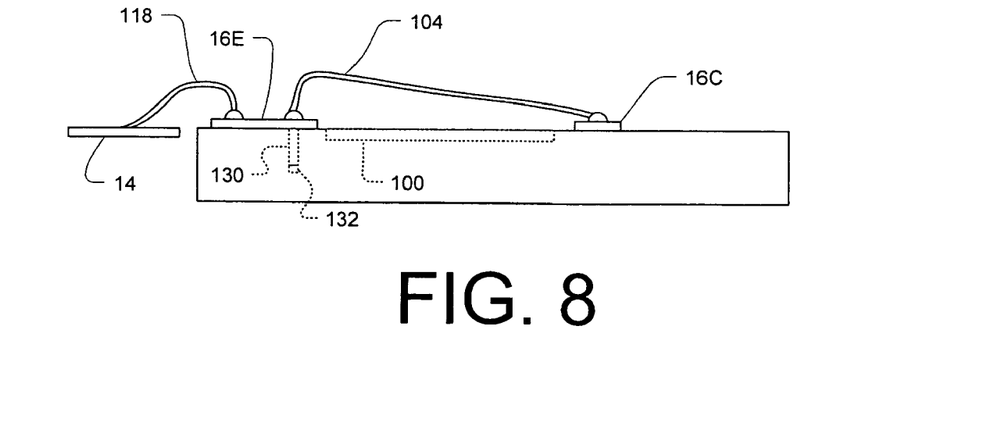
FIG. 8 is a simplified and enlarged two-dimensional side-view of the semiconductor device of FIG. 7.

Referring now to FIGS. 7 and 8, the use of vias and interconnecting layers between the I/O pad 16A and the bonding surfaces 16B can be omitted if ground or another reference potential is directly connected to the bonding surfaces 16B as shown. In other words, at least one of the bonding surfaces 16A that is connected to the reference potential is directly connected to one or more of the bonding surfaces 16B as shown at 16E. One or more of the remaining bonding surfaces 16B are connected by vias 130 and interconnecting layer 132 as shown and/or using additional direct connections, bond wires or other connection types.

Figure 9:
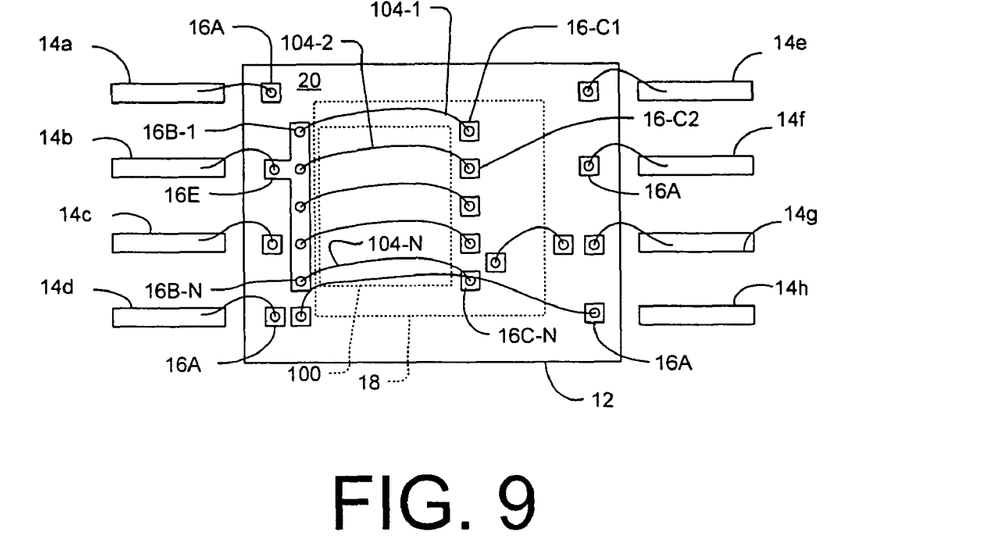
FIG. 9 is a two-dimensional top-view of a semiconductor device with a shielded area of a semiconductor die located between bond surfaces connected by bond wires according to some implementations.
Figure 10:
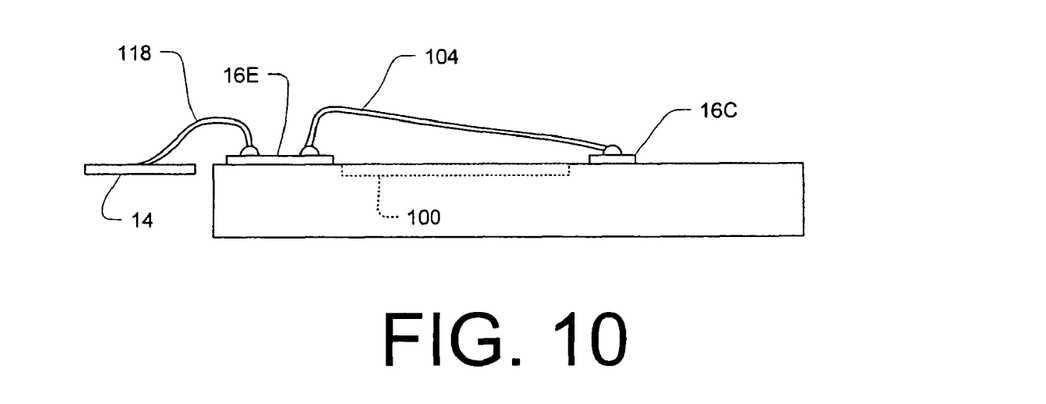
FIG. 10 is a simplified and enlarged two-dimensional side-view of the semiconductor device of FIG. 9.

Referring now to FIGS. 9 and 10, the use of vias and interconnecting layers can be omitted and/or used in other ways if ground or another reference potential is directly connected by the I/O bonding surface 16A to the bonding pads 16B and the bonding surfaces 16B are also directly connected as shown. While several examples of vias and direct connections are shown in FIGS. 5-10, skilled artisans will appreciate that any other combination of vias and/or direct connections can be used.

Figure 11:
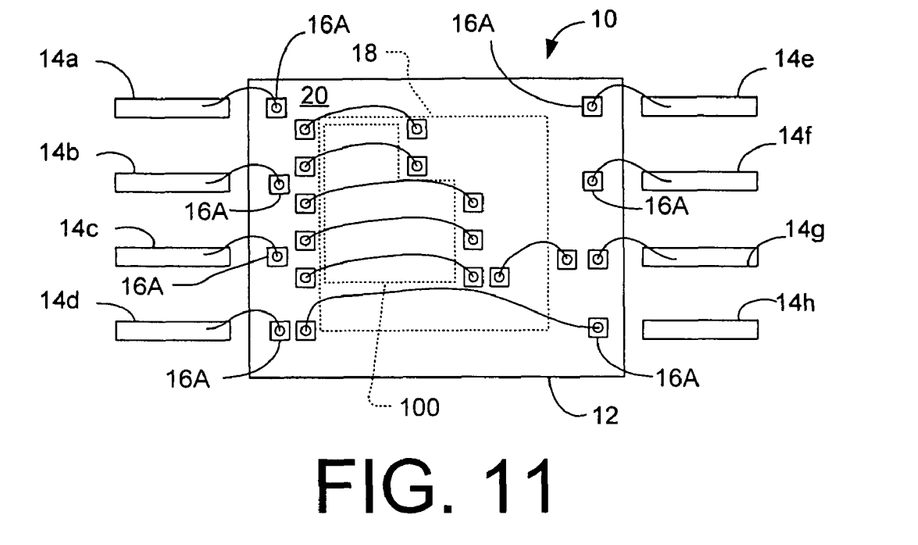
FIG. 11 is a two-dimensional top-view of an alternate semiconductor device of a semiconductor die with a shielded area between bond surfaces connected by bond wires according to some implementations.

Referring now to FIGS. 5, 7, 9 and 11, the shielded area 100 may have a variety of shapes. For example, the shielded area 100 can have a rectangular shape as shown in FIGS. 5, 7 and 9. The shielded area 100 can also have a stair-step shape as shown in FIG. 11 and/or any other shape can be used.

A number of embodiments of the invention have been described. Nevertheless, it will be understood that various modifications may be made without departing from the spirit and scope of the invention. Accordingly, other embodiments are within the scope of the following claims.

What is claimed is:

1. An integrated circuit, comprising:
a semiconductor die including:
N bond pad pairs each including a first bond pad and a second bond pad that is spaced from said first bond pad; and
N bond wires each associated with a respective one of said N bond pad pairs, each of said bond wires having opposite ends that communicate with said first and second bond pads of a respective one of said N bond pad pairs,
wherein said first and second bond pads of said N bond pad pairs are connected to a reference potential that is substantially constant and create a shielded area between said N bond pad pairs, and wherein upper surfaces of said semiconductor die and said shielded area are coplanar.

2. The integrated circuit of claim 1 wherein said bond wires comprise a metallic material selected from the group consisting of gold, aluminum, and copper.

3. The integrated circuit of claim 1 wherein said bond wires are bonded to the first and second bond pads using a wire bond type selected from the group consisting of ball bonds, stitch bonds, stitch bonds on bonding pad, and stitch bonds on ball.

4. The integrated circuit of claim 1 further comprising an interconnecting layer in the semiconductor die that is connected by vias to at least one of said first bond pads of at least one of said N bond pad pairs.

5. The integrated circuit of claim 1 wherein said reference potential is ground.

6. The integrated circuit of claim 1 further comprising:
an I/O bond pad; and
an I/O bond wire having one end that communicates with said reference potential and an opposite end that communicates with said I/O bond pad.

7. A system comprising the integrated circuit of claim 6 and further comprising a lead finger that communicates with said reference potential and said one end of said I/O bond wire.

8. The integrated circuit of claim 1 further comprising an I/O bond pad that directly contacts at least one of said first bond pads of at least one of said N bond pad pairs, wherein said first bond pads of said N bond pad pairs directly contact each other.

9. The integrated circuit of claim 1 further comprising an I/O bond pad that is connected to first vias, which are connected by an interconnecting layer and second vias to at least one of said first bond pads of at least one of said N bond pad pairs.

10. The integrated circuit of claim 1 further comprising an I/O bond pad that directly contacts at least one of said first bond pads of said N bond pad pairs, wherein remaining ones of said first bond pads are connected by vias and an interconnecting layer to said at least one of said first bond pads.

11. The integrated circuit of claim 1 further comprising an I/O bond pad that is connected to first vias, which are connected to by an interconnecting layer and second vias to at least one of said first bond pads of said N bond pad pairs, wherein remaining ones of said first bond pads are directly connected to said at least one of said first bond pads.

12. The integrated circuit of claim 1 further comprising a circuit that is fabricated in said semiconductor die in said shielded area and is located entirely within outer edges of said shielded area.

13. An integrated circuit, comprising:
a semiconductor die including:
N pairs of electrical termination means for providing an electrical connection, each including first electrical termination means for providing an electrical connection and second electrical termination means for providing an electrical connection and that is spaced from said first electrical termination means; and
N elongate conducting means for conducting, each associated with a respective one of said N pairs of electrical termination means, each of said elongate conducting means having opposite ends that communicate with said first and second electrical termination means of a respective one of said N pairs of electrical termination means,
wherein said first and second electrical termination means of said N pairs of electrical termination means are connected to a reference potential that is substantially constant and create a shielded area between said N pairs of electrical termination means, and wherein upper surfaces of said semiconductor die and said shielded area are coplanar.

14. The integrated circuit of claim 13 wherein said elongate conducting means comprise bond wire made of a metallic material selected from the group consisting of gold, aluminum, and copper.

15. The integrated circuit of claim 13 wherein said elongate conducting means are bonded to the first and second electrical termination means using a wire bond type selected from the group consisting of ball bonds, stitch bonds, stitch bonds on bonding pad, and stitch bonds on ball.

16. The integrated circuit of claim 13 further comprising interconnecting means for conducting that is located in the semiconductor die and that is connected by via conducting means for conducting to at least one of said first electrical termination means of at least one of said N pairs of electrical termination means.

17. The integrated circuit of claim 13 wherein said reference potential is ground.

18. The integrated circuit of claim 13 further comprising:
I/O electrical termination means for providing an electrical connection on said semiconductor die; and
I/O elongate conducting means for conducting and having one end that communicates with said reference potential and an opposite end that communicates with said I/O electrical termination means.

19. The integrated circuit of claim 13 further comprising I/O electrical termination means for providing an electrical connection on said semiconductor die and that directly contacts at least one of said first electrical termination means of at least one of said N pairs of electrical termination means and wherein said first electrical termination means of said N pairs of electrical termination means contact each other.

20. The integrated circuit of claim 13 further comprising I/O electrical termination means for providing an electrical connection on said semiconductor die and that is connected to a first via, which is connected by an interconnecting layer and a second via to at least one of said first electrical termination means of at least one of said N pairs of electrical termination means.

21. The integrated circuit of claim 13 further comprising I/O electrical termination means for providing an electrical connection on said semiconductor die and that directly contacts at least one of said first electrical termination means of said N pairs of electrical termination means, wherein remaining ones of said first electrical termination means are connected by via conducting means for conducting and interconnecting means for conducting to said at least one of said first electrical termination means.

22. The integrated circuit of claim 13 further comprising I/O electrical termination means for providing an electrical connection on said semiconductor die and that is connected to first via conducting means for conducting, which is connected to by an interconnecting means for conducting and second via conducting means for conducting to at least one of said first electrical termination means of said N pairs of electrical termination means, wherein remaining ones of said first electrical termination means are directly connected to said at least one of said first electrical termination means.

23. The integrated circuit of claim 13 further comprising circuit means for performing a circuit function and that is fabricated in said semiconductor die in said shielded area and is located entirely within outer edges of said shielded area.

* * * * *